(12) United States Patent
Hou et al.

(10) Patent No.: US 8,217,469 B2
(45) Date of Patent: Jul. 10, 2012

(54) CONTACT IMPLEMENT STRUCTURE FOR HIGH DENSITY DESIGN

(75) Inventors: Yung-Chin Hou, Taipei (TW); Yuh-Jier Mii, Hsin-Chu (TW); Kuo-Tung Sung, Zhodong Town (TW); Li-Chun Tien, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 153 days.

(21) Appl. No.: 12/701,649

(22) Filed: Feb. 8, 2010

(65) Prior Publication Data
US 2011/0140203 A1 Jun. 16, 2011

Related U.S. Application Data

(60) Provisional application No. 61/285,840, filed on Dec. 11, 2009.

(51) Int. Cl.
*H01L 27/088* (2006.01)
(52) U.S. Cl. ........ 257/401; 257/288; 257/341; 257/350; 257/368; 257/900

(58) Field of Classification Search .................. 257/288, 257/341, 350, 368, 401, 900, E27.014, E27.099, 257/E29.13, E29.26, E29.263
See application file for complete search history.

(56) References Cited

U.S. PATENT DOCUMENTS

| | | | | |
|---|---|---|---|---|
| 7,808,051 B2 * | 10/2010 | Hou et al. | ...... | 257/368 |
| 2009/0315079 A1 * | 12/2009 | Tien et al. | ...... | 257/207 |
| 2010/0078725 A1 * | 4/2010 | Hou et al. | ...... | 257/368 |
| 2010/0127333 A1 * | 5/2010 | Hou et al. | ...... | 257/368 |

\* cited by examiner

*Primary Examiner* — N Drew Richards
*Assistant Examiner* — Joannie A Garcia
(74) *Attorney, Agent, or Firm* — Haynes and Boone, LLP (57) ABSTRACT

The present disclosure provides a device in an integrated circuit. The device includes an active region in a semiconductor substrate; an isolation region adjacent the active region; a gate disposed on the active region and extending to the isolation region in a first direction; and a gate contact disposed within the isolation region, having a portion directly overlying and contacting the gate, and having a geometry horizontally extending to a first dimension in the first direction and a second dimension in a second direction approximately perpendicular to the first direction. The first dimension is greater than the second dimension.

20 Claims, 8 Drawing Sheets

CONTACT IMPLEMENT STRUCTURE FOR HIGH DENSITY DESIGN

PRIORITY DATA

This application claims priority to Provisional Application Ser. No. 61/285,840 filed on Dec. 11, 2009, the entire disclosure of which is incorporated herein by reference.

BACKGROUND

When a semiconductor device such as a metal-oxide-semiconductor field-effect transistors (MOSFETs) is scaled down through various advanced technology nodes, device packing density and device performance are challenged by device layout and contact configuration. Due to more and more restricted design rule (RDR) limitations in advanced technology nodes, such as 65 nm, 40 nm, and 32 nm and beyond, there are various concerns related to the packing density, processing windows, and circuit performance. In various examples, poly-gate jog structure requires more precise critical dimension (CD) control in fabrication process, which impacts the gate density and packing density, causing chip area increase and design cost increase. In another example, an extra metal layer may be implemented to avoid poly gate jog and be compliant with the design rules. In this case, the chip area increases and the fabrication cost increases as well. Therefore, there is a need for a new integrated circuit structure and layout to address the above issues.

SUMMARY

The present disclosure provides a device in an integrated circuit. The device includes an active region in a semiconductor substrate; an isolation region adjacent the active region; a gate disposed on the active region and extending to the isolation region in a first direction; and a gate contact disposed within the isolation region, having a portion directly overlying and contacting the gate, and having a geometry horizontally extending to a first dimension in the first direction and a second dimension in a second direction approximately perpendicular to the first direction. The first dimension is greater than the second dimension.

The present disclosure also provides another embodiment of a field effect transistor (FET) in an integrated circuit. The FET includes an active region in a semiconductor substrate; an isolation region adjacent the active region; a gate disposed on the active region, and extending to the isolation region in a first direction; a source and a drain formed in the active region and spaced in a second direction approximately perpendicular to the first direction; and a gate contact disposed within the isolation region and having a portion directly overlying and contacting the gate, wherein the gate contact, in a top view, includes outlines defining a first dimension in the first direction and a second dimension in the second direction, the first dimension being greater than the second dimension.

The present disclosure also provides another embodiment of an integrated circuit. The integrated circuit includes an active region in a semiconductor substrate; an isolation region adjacent the active region; first and second gates disposed on the active region, and extending to the isolation region in a first direction, wherein the first and second gates are spaced in a second direction approximately perpendicular to the first direction; and a gate contact having portions respectively overlying and contacting the first and second gates within the isolation region.

The present disclosure also provides yet another embodiment of an integrated circuit. The integrated circuit includes an active region in a semiconductor substrate; an isolation region adjacent the active region; a gate disposed on the active region, and extending to the isolation region in a first direction; and a gate contact having an elongated portion overlying and contacting the gate within the isolation region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
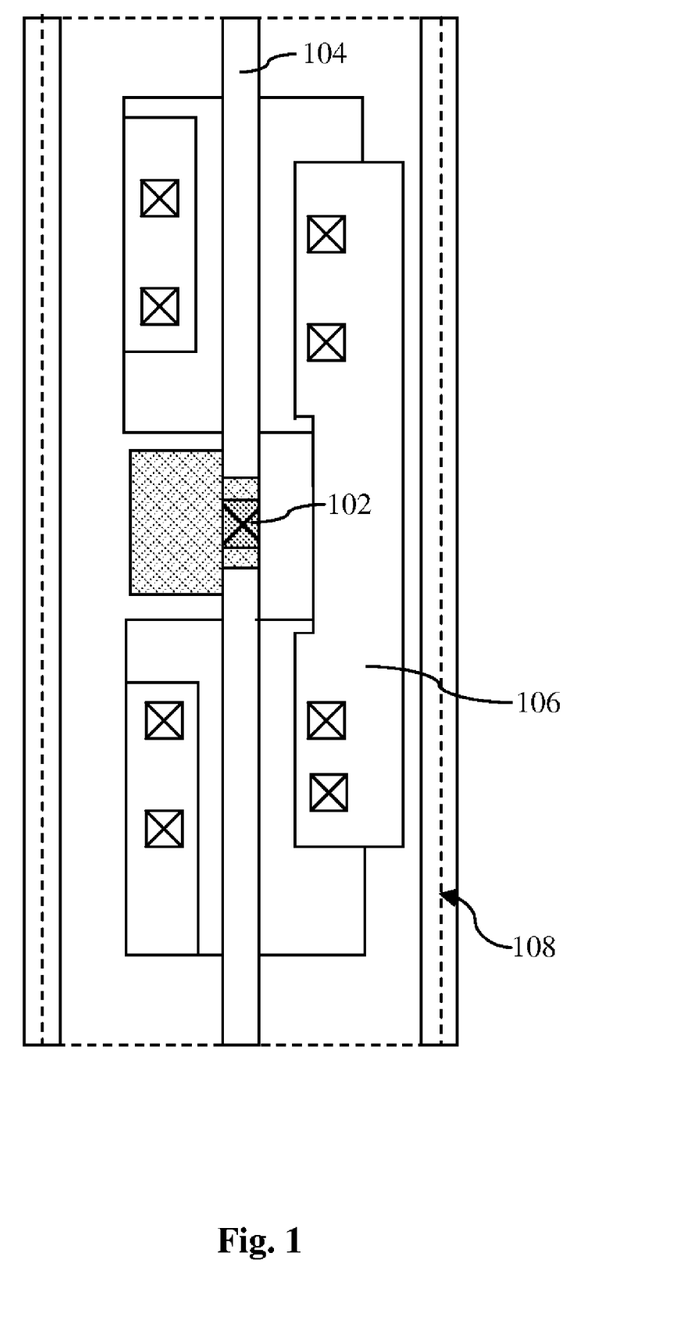
FIGS. 1-4 are top views of a semiconductor structure in various examples.
Figure 2:
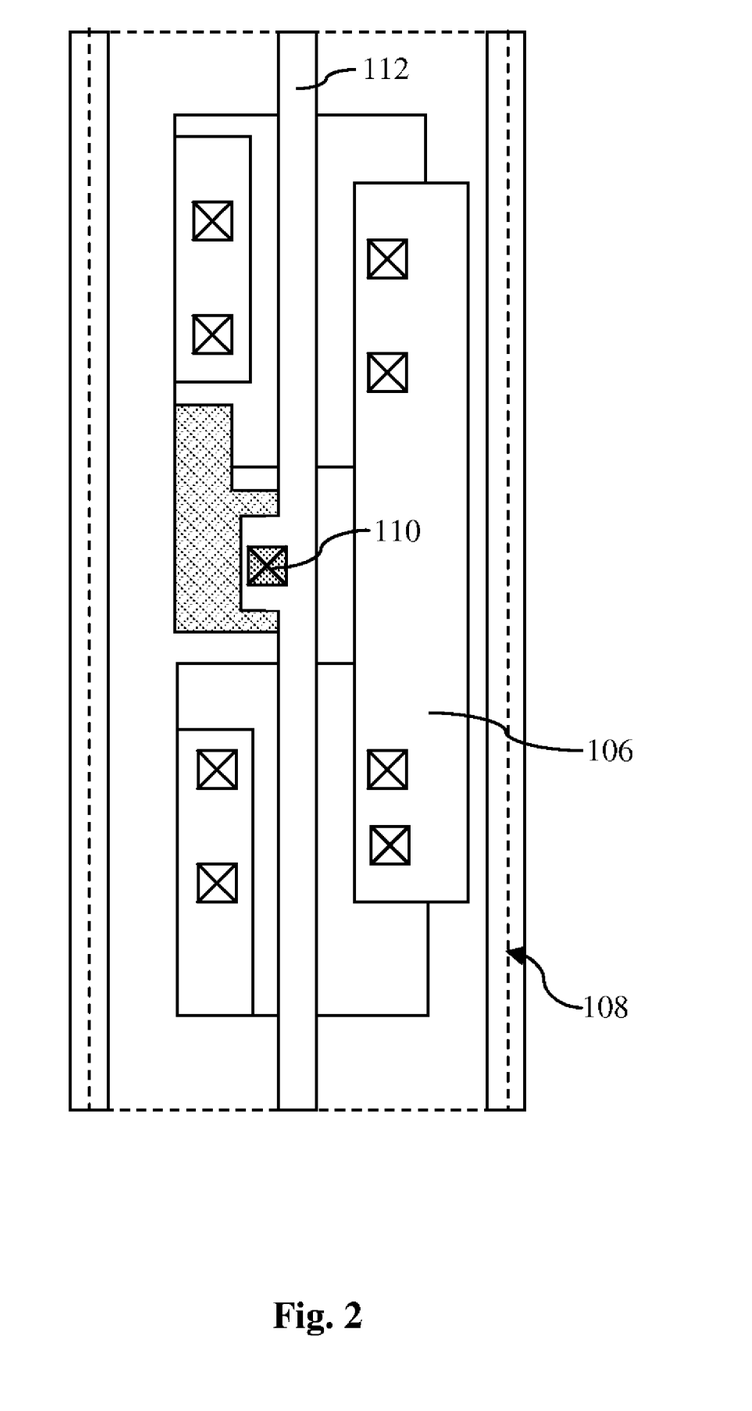
Figure 3:
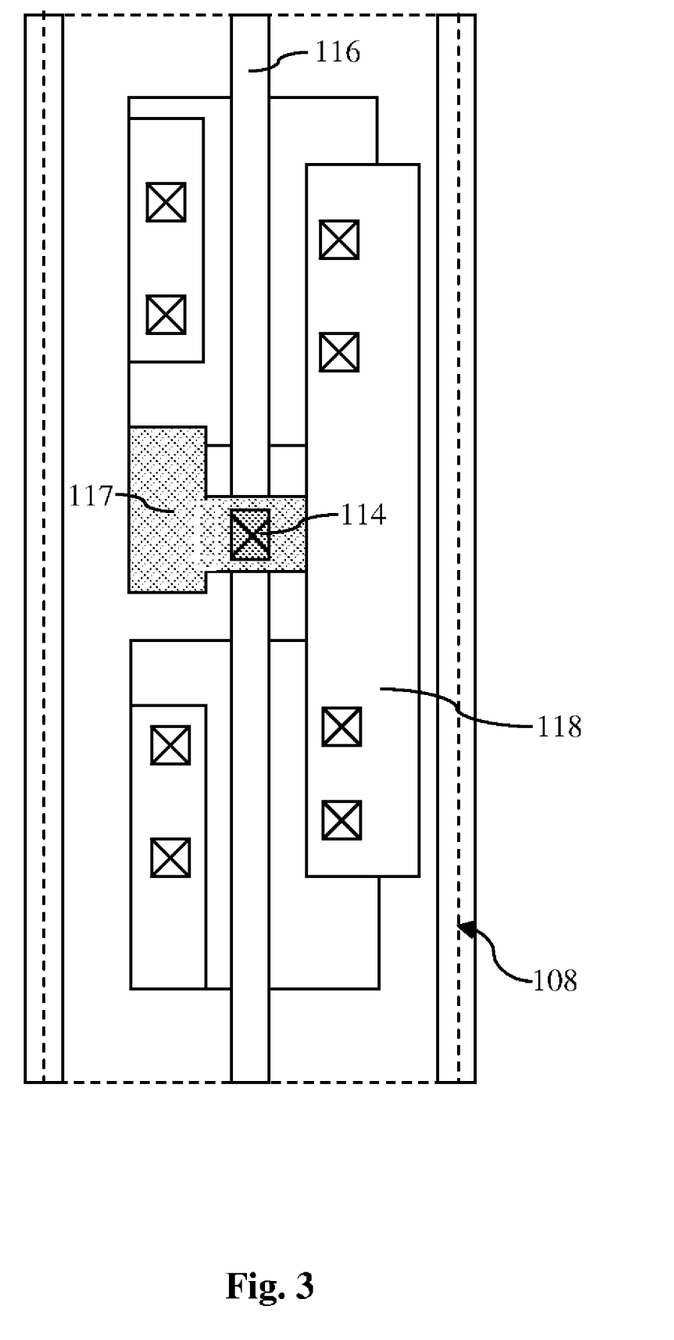
Figure 4:
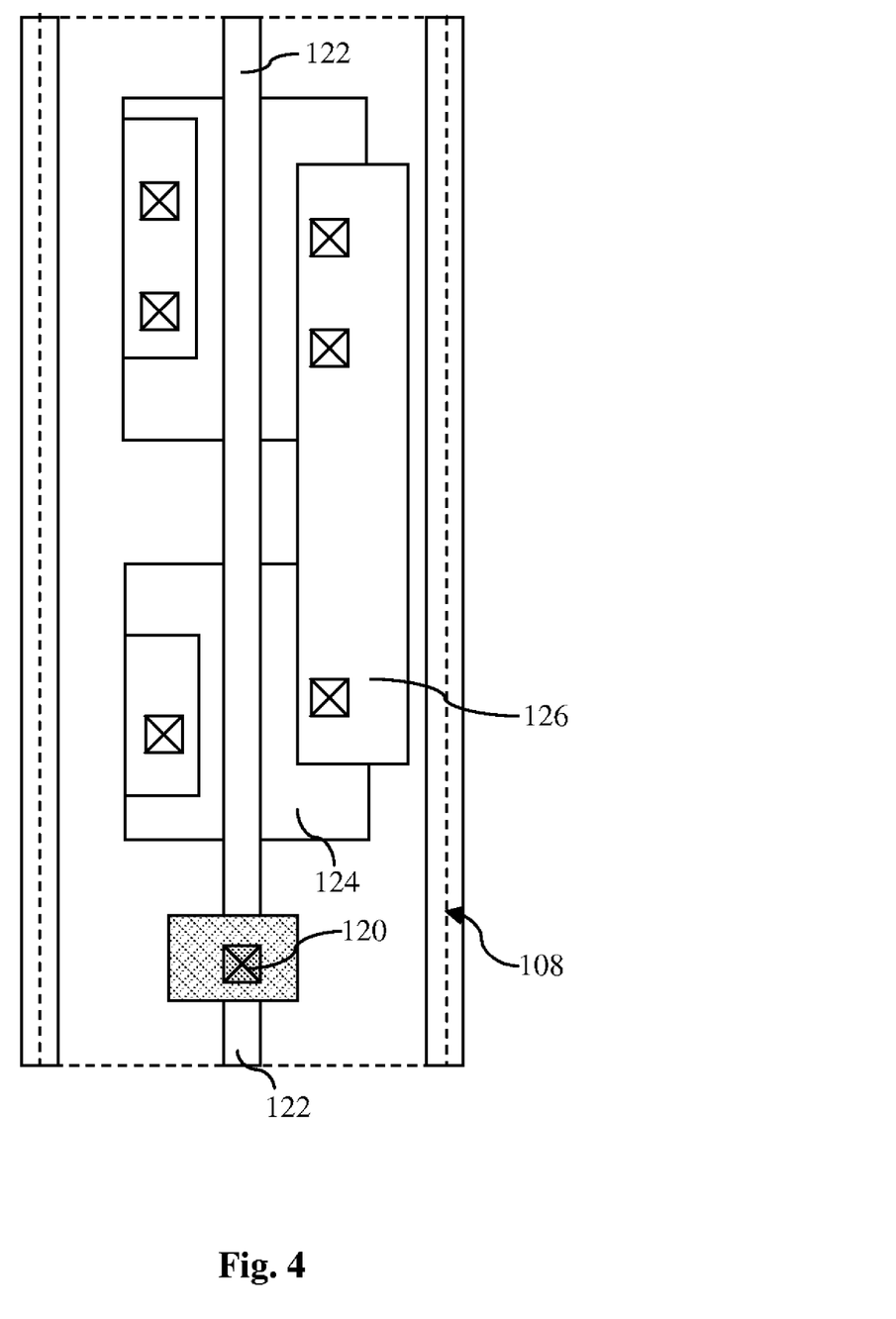

FIGS. 1 through 4 are top views of a semiconductor structure dealing with packing density and device area in various examples. In FIG. 1, a gate contact 102 lands on a gate 104. The gate contact 102 has a square shape in a top view. However, to have acceptable contact resistance, the contact area between the gate contact 102 and the gate 104 has to be sufficiently large. Large square dimensions of the gate contact 102 may cause the metal line 106 to be recessed to a cell boundary 108. For example, the spacing between the recessed metal line 106 and the cell boundary 108 is about 10 nm or less. In FIG. 2, a gate contact 110 lands on a gate 112. The gate contact has a square shape in a top view. To have acceptable contact area and thus contact resistance, the gate 112 has a protruded portion, also referred to as a jog structure, to increase the contact area for gate contact landing on the gate. However, large square dimensions of the gate contact 102 cause the metal line 106 to be recessed to a cell boundary 108. In one example, the spacing between the recessed metal line 106 and the cell boundary 108 is about 10 nm or less. The protruded portion of the gate leads to gate rounding issue and further leads to the device performance degradation. In FIG. 3, a gate contact 114 has a square geometry and lands on a gate 116 without a protruded portion. In this case, the metal feature 117 to be coupled with the gate contact 114 may be configured in metal 1. A metal line 118 to be coupled with the drain region(s) is configured on an extra metal layer, such as metal 2 instead of metal 1, which introduces an additional metal layer to the integrated circuit and adds the cost to the integrated circuit. In FIG. 4, a gate contact 120 of a square geometry is relocated to an edge and lands on a gate 122. However, the active region 124 has to be shrunken and the metal line 126 to be coupled with Vss is configured to an extra metal layer, such as metal 2 instead of metal 1, which introduces an additional metal layer to the integrated circuit and adds the cost to the integrated circuit.

Figure 5:
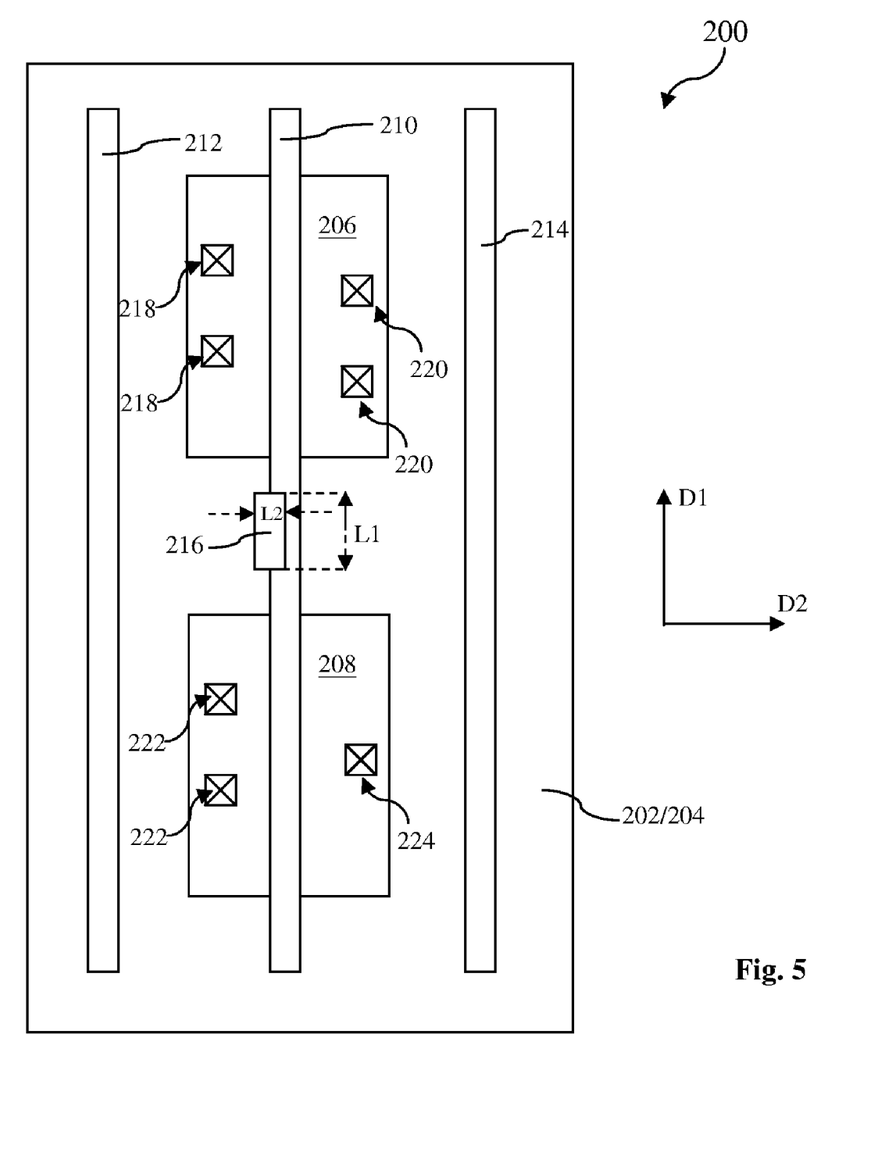
FIGS. 5-6 are top views of a semiconductor structure in various embodiments, constructed according to various aspects of the present disclosure.

FIG. 5 is a top view of a semiconductor structure 200 constructed according to various aspects of the present disclosure. As the various disadvantages and issues discussed above in the various layouts illustrated in FIGS. 1 to 4, the semiconductor 200 is provided to address the above concerns and is described below according to one or more embodiments. The semiconductor structure 200 is a portion of an integrated circuit or a portion of a semiconductor chip. The semiconductor structure 200 includes a semiconductor substrate 202. In one embodiment, the semiconductor substrate 202 is a silicon substrate. The semiconductor substrate 202 may alternatively or additionally includes other suitable semiconductor material. Various isolation regions 204, such as shallow trench isolation (STI), are formed in the semiconductor substrate and define various active regions, such as first and second active regions 206 and 208. The active regions 206 and 208 are interposed by the isolation region 204. In one exemplary embodiment, the first active region 206 includes a n-type well having a n-type dopant or is alternatively formed in a n-type substrate. The second active region 208 includes a p-type well having a p-type dopant or is alternatively formed in a p-type substrate. In another embodiment, the n-type well in the first active region 206 is formed by an ion implantation using n-type species. The p-type well in the second active region 208 is formed by another ion implantation using p-type species.

The active region 206 further includes other doped features, such as source and drain, formed by various doping processes including ion implantations. Similarly, in another embodiment, the active region 208 includes other doped features, such as source and drain, formed by ion implantations or other suitable doping processes.

The semiconductor structure 200 further includes a gate 210 disposed on the active region 206 and extended to the isolation region 204. In this example, the gate 210 disposed on both active regions 206, 208, and the isolation region 204 interposed therebetween. The gate 210 is designed to have a strip shape substantially aligned in a first direction D1 and is properly configured on the active region(s). For example, the gate 210 is interposed between the source and drain of the active region 206, and may be additionally interposed between the source and drain of the active region 208. The source and drain of the active region are spaced in a second direction D2, as illustrated in FIG. 5. In one embodiment, the gate 210 includes substantial straight outlines aligned with the first direction D1 and defining a straight strip geometry in a top view. The gate 210 includes a gate dielectric layer disposed on the substrate and a conductive layer disposed on the gate dielectric. In one embodiment, the gate dielectric layer includes silicon oxide and the conductive material layer includes doped polysilicon. The gate 210 can be formed by any suitable process, such as a process including forming a thermal silicon oxide, depositing polysilicon, and patterning the silicon oxide and polysilicon. Alternatively, the gate dielectric layer includes a dielectric material having a high dielectric constant, also referred to as high k dielectric. The conductive material layer includes metal or metal alloy. Additionally, the semiconductor structure 200 may further other gates disposed adjacent the gate 210. For examples, dummy gates, such as gates 212 and 214, are disposed on the isolation region 204 and configured substantially parallel with the gate 210. In one example, the gates 212 and 214 are substantially similar to the gate 210 in terms of composition and formation.

The semiconductor structure 200 includes a gate contact 216 configured to couple the gate 210 to a metal line. The gate contact 216 is disposed within the isolation region 204. The gate contact 216 has at least a portion thereof directly overlying the gate 210 and landing on the gate 210. The gate contact 216 is designed to have a geometry defining a first dimension L1 in the first direction D1 and a second dimension L2 in the second direction D2. The first dimension L1 is substantially greater than the second dimension L2. In present embodiment, the gate contact is a rectangle aligned with the gate 210 in the first direction D1, also referred to as a slot gate contact. Instead of square gate contact, the slot gate contact is used to increase the contact area between the gate contact 216 and the gate 210, and therefore reducing the contact resistance. In one example, the gate contact 216 has the first dimension L1 ranging between about 60 nm and 120 nm. In another embodiment, the first dimension L1 is about 100 nm and the second dimension L2 is about 40 nm. In present embodiment, the gate contact 216 partially lands on the gate 210. For example, the gate contact 216 has about 50% landing on the gate 210 and about 50% landing on the STI. Alternatively, the gate contact can be any other proper shape that is elongated in the first direction D1 to increase the contacting area and maintains a limited dimension in the second direction D2 to increase the packing density. In another embodiment, the gate contact 216 includes an extended portion extending from the slot portion to a portion of the active region 206 to coupled therewith. In another embodiment, the extended portion of the gate contact 216 is extending within the isolation feature to couple with an adjacent gate contact. The gate contact 216 include various suitable conductive material. In one embodiment, the gate contact 216 includes tungsten (W). The gate contact 216 can be formed by a suitable process, such as a process including deposition dielectric material, polishing, patterning the dielectric material to form a contact hole, filling the contact hole with a conductive material, and polishing. In one example, the polishing includes a chemical mechanic polishing (CMP) process.

The semiconductor structure 200 further includes other contacts directly overlying on the active region 206 and landing on various portions of the active region 206. In one embodiment, the semiconductor structure 200 includes contact(s) 218 landing on the source and contact(s) 220 landing on the drain in the active region 206 and coupling to respective metal lines. In another embodiment, the semiconductor structure 200 further includes contact(s) 222 landing on the source and contact(s) 224 landing on the drain in the active region 208 and coupling to respective metal lines. In one embodiment, the semiconductor structure 200 includes a transistor, such as a metal-oxide-semiconductor field effect transistor (MOSFET). In one example, the semiconductor structure 200 includes a n-type MOSFET formed in the active region 206 and a p-type MOSFET formed in the active region 208. In another example, the contact 220 to the drain in the active region 206 and the contact 222 to the drain in the active region 208 are tied together by coupling to a same metal line. In this case, the n-type MOSFET in the active region 206 and a p-type MOSFET formed in the active region 208 are configured to form a MOSFET inverter. The disclosed semiconductor structure 200 having the elongated gate contact 216 landing on the gate 210 can be utilized and designed to form other proper devices, such as a standard cell (e.g. a MOSFET, or a MOSFET inverter), an input/output cell, embedded device, dynamic random access memory (DRAM), static random access memory (SRAM), or a mixed-signal circuit in various embodiments. In various embodiments of the disclosed semiconductor structure 200, various advantages may present. For example, there is no need for an extra metal layer to satisfy the restricted design rule (RDR). For example, the gate was kept in a straight shape without the protruded portion and the gate CD is well controlled. In another example, the RDR is satisfied without the cost of the cell area in chip design.

Figure 6:
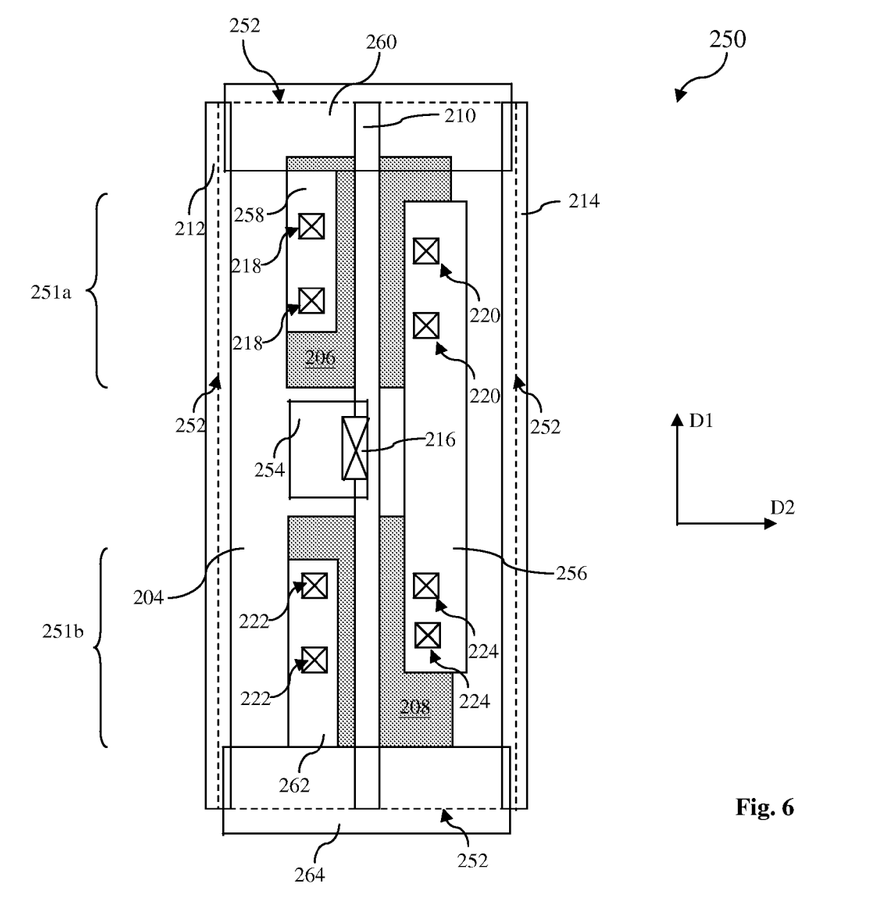

FIG. 6 is a top view of a semiconductor structure 250 constructed according to various aspects of the present disclosure in another embodiment. The semiconductor structure 250 includes a MOSFET inverter formed in a standard cell 252, defined by the broken lines in FIG. 6. The semiconductor structure 250 includes a p-type MOSFET 251a and a n-type MOSFET 251b. The semiconductor structure 250 includes an isolation region 204, further includes a first active region 206 and a second active regions 208. The active regions 206 and 208 are interposed by the isolation region 204. The first active region 206 includes a n-type well having a n-type dopant or is alternatively formed in a n-type substrate. The second active region 208 includes a p-type well having a p-type dopant or is alternatively formed in a p-type substrate. The active region 206 further includes source and drain interposed by a gate 210 and doped by p-type dopant. Similarly, the active region 208 includes source and drain interposed by the gate 210 and doped by n-type dopant. The gate 210 disposed on the active region 206, the active region 208, and the isolation region 204 between the active regions (206 and 208). The gate 210 is designed to have a strip shape substantially aligned in a first direction D1. The source and drain of the active region 206 are spaced in a second direction D2. For example, the source is configured in the left portion of the active region 206 and the drain is configured in the right portion of the active region 206. Typically, the source and drain are respectively overlapped to the left portion and right portion of the active region, separated by the gate 210, therefore are not labeled in FIG. 6. Similarly, the source and drain of the active region 208 are spaced in a second direction D2. For example, the source is configured in the left portion of the active region 208 and the drain is configured in the right portion of the active region 208. In one embodiment, the gate 210 includes substantial straight outlines in the first direction D1, defining a straight strip geometry in a top view. The gate 210 includes a gate dielectric layer disposed on the substrate and a conductive layer disposed on the gate dielectric. In one embodiment, the gate dielectric layer includes silicon oxide and the conductive material layer includes doped polysilicon. The semiconductor structure 250 may additionally include dummy gates 212 and 214 disposed in the isolation region and configured on the borders of the standard cell 252. The gates 210, 212 and 214 are substantially similar to the gates 210, 212 and 214 of FIG. 5 in terms of composition and formation.

The semiconductor structure 250 includes a gate contact 216 configured to couple the gate 210 to a metal feature 254 in a metal layer, such as metal one in this embodiment. The gate contact 216 may be substantially similar to the gate contact 216 in FIG. 5 in terms of geometry, configuration, composition and formation. The gate contact 216 is disposed within the isolation region 204. The gate contact 216 has at least a portion thereof directly overlying the gate 210 and landing on the gate 210. The gate contact 216 is designed to have a geometry defining a first dimension L1 in the first direction D1 and a second dimension L2 in the second direction D2. The first dimension L1 is substantially greater than the second dimension L2. In present embodiment, the gate contact is a rectangle aligned with the gate 210 in the first direction D1, also referred to as a slot gate contact. Instead of square gate contact, the slot gate contact is used to increase the contact area between the gate contact 216 and the gate 210, and therefore reducing the contact resistance. In one example, the gate contact 216 has the first dimension L1 ranging between about 60 nm and 120 nm. In another embodiment, the first dimension L1 is about 100 nm and the second dimension L2 is about 40 nm. In present embodiment, the gate contact 216 partially lands on the gate 210. For example, the gate contact 216 has about 50% landing on the gate 210 and about 50% landing on the STI. Alternatively, the gate contact can be any other proper shape that is elongated to L1 in the first direction D1 to increase the contacting area and maintains a small dimension L2 in the second direction D2 to increase the packing density. The metal feature 254 is configured as an input of the inverter. The contact 220 couples the drain of the p-type MOSFET 251a to the metal feature 256 in the metal layer (metal one in this example). The contact 224 couples the drain of the n-type MOSFET 251b to the metal feature 256. The drain of the n-type MOSFET 251a and the drain of the p-type MOSFET 251b are thus tied and coupled to an output of the inverter. The contact 218 couples the source of the p-type MOSFET 251a to the metal feature 258 in the metal layer (metal one in this example). The metal feature 258 is coupled to the power line Vdd through the metal feature 260. Similarly, the contact 222 couples the source of the n-type MOSFET 251b to the metal feature 262 in the metal layer. The metal feature 262 is coupled to the power line Vss through the metal feature 264. The various metal features 254, 256, 258, 260, 262, and 264 are all formed in the same metal layer, such as the metal one in this example. Therefore there is no need for an extra metal layer.

Figure 7:
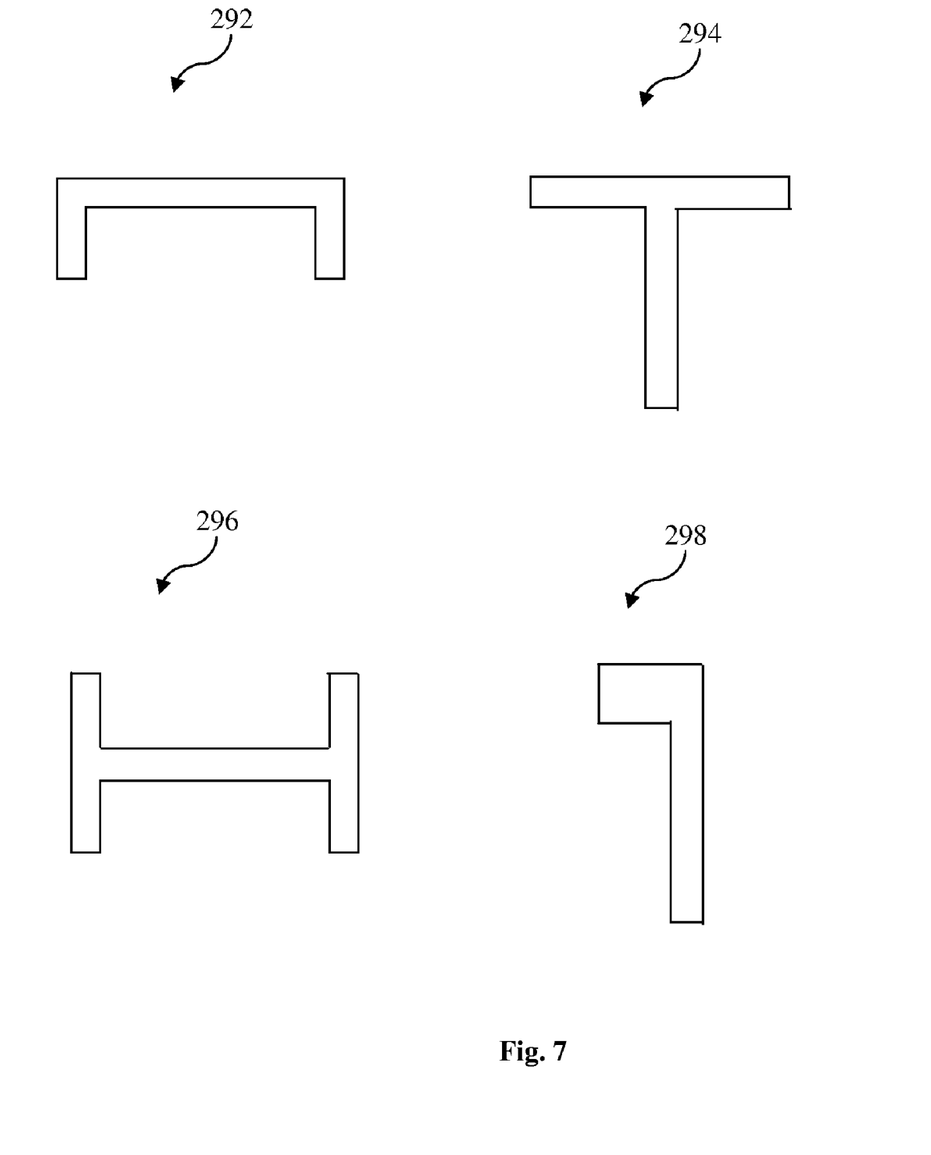
FIG. 7 is a top view of a contact structure in different embodiments, constructed according to various aspects of the present disclosure.
Figure 8:
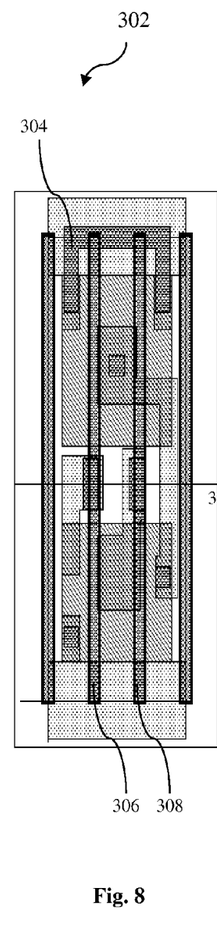
FIGS. 8-11 are top views of a semiconductor structure in various embodiments, constructed according to various aspects of the present disclosure.

The present disclosure also provides other non-conventional geometries of a gate contact in various embodiments. FIG. 7 illustrates various exemplary gate contacts in top view. In one embodiment, a gate contact 292 has a U-shape. In another embodiment, a gate contact 294 has a T-shape. In another embodiment, a gate contact 296 has a H-shape. In another embodiment, a gate contact 298 has a L-shape. Those non-conventional gate contacts include a portion having an elongated shape such that the contact area is elongated in one direction to increase the contact area or couple other device feature. The gate contact includes one or more additional feature, each may be elongated in a certain direction to couple with another feature, such as a source, a drain, or another gate in the same device cell.

In furtherance of those non-conventional gate contacts illustrated in FIG. 7, various exemplary embodiments are provided in FIGS. 8 to 11 in top views. A standard cell 302 in FIG. 8 includes a U-shaped gate contact 304, similar to the gate contact 292 of FIG. 7. The U-shaped gate contact 304 includes a first portion with an elongated shape partially landing on a first gate 306 and a second gate 308. The first portion is within the isolation region and is elongated in a first direction perpendicular to the gates 306 and 308. The U-shaped gate contact 304 further includes a second portion elongated in a second direction parallel with the gates 306 and 308, and extending to a source/drain (S/D) on a side of the first gate 306 remote the second gate 308. The U-shaped gate contact 304 further includes a third portion elongated in a second direction and extending to a source/drain (S/D) on a side of the second gate 308 remote the first gate 306.

Figure 9:
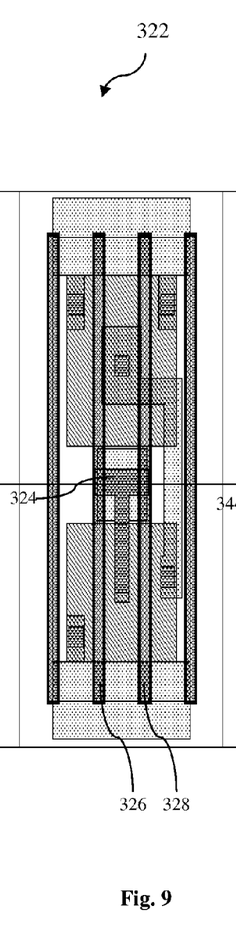

A standard cell 322 in FIG. 9 includes a T-shaped gate contact 324, similar to the gate contact 294 of FIG. 7. The T-shaped gate contact 324 includes a first portion with an elongated shape partially landing on a first gate 306 and a second gate 308. The first portion is within the isolation region and is elongated in a first direction perpendicular to the gates 326 and 328. The T-shaped gate contact 324 further includes a second portion elongated in a second direction parallel with the gates 326 and 328, and extending to a source/drain (S/D) interposed between the first gate 326 and the second gate 328.

Figures 10, 11:
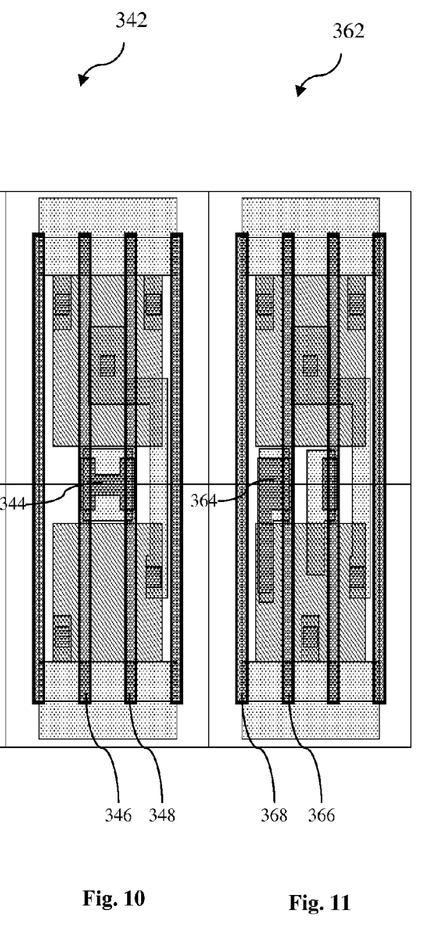

A standard cell 342 in FIG. 10 includes a H-shaped gate contact 344 disposed within the isolation region, similar to the gate contact 296 of FIG. 7. The H-shaped gate contact 344 includes a first portion with an elongated shape partially landing on the STI between a first gate 346 and a second gate 348. The first portion is elongated in a first direction perpendicular to the gates 346 and 348. The T-shaped gate contact 324 further includes a second portion elongated in a second direction parallel with the gates 346 and 348, and substantially landing on the first gate 346. The T-shaped gate contact 324 further includes a third portion elongated in a second direction, and substantially lands on the second gate 348.

A standard cell 362 in FIG. 11 includes a L-shaped gate contact 364, similar to the gate contact 298 of FIG. 7. The L-shaped gate contact 364 includes a first portion disposed within the isolation region and having an elongated shape partially landing on a first gate 366. A dummy gate 368 is disposed adjacent the first gate 366. The first portion is elongated in a direction parallel with the gates 346, therefore the contact area between the gate 366 and the first portion of the gate contact 364 is effectively increased. The L-shaped gate contact 364 further includes a second portion elongated in another direction perpendicular to the gates 366 and 368, and extending to a S/D in an active region between the first gate 366 and the dummy gate 368.

Various advantages that may present in different embodiments of the disclosed structure include consistent device performance, satisfied restricted design rule, and/or eliminated cost on extra metal layer. In another example, there is no device area penalty in the disclosed structure. Other advantages may present in various applications. For example, since only circuit layout is designed differently according to the disclosed structure, there is no change to the fabrication process flow. Therefore, there is no additional masking cost and manufacturing cost. It is understood that different embodiments disclosed herein offer different advantages and that no particular advantage is necessarily required in all embodiments.

The disclosed gate contact has an elongated portion configured in one device cell and disposed at least partially in an isolation region. In one embodiment, the elongated portion of the gate contact is aligned with that corresponding gate and extending to a source/drain adjacent the gate. In another embodiment, the elongated portion is substantially perpendicular to the two adjacent gates, and landing on both adjacent gates. In another embodiment, the gate contact may includes various combination of the above portions. In another embodiment, the disclosed elongated contact can be formed in other device features, such as source and drain.

Although embodiments of the present disclosure have been described in detail, those skilled in the art should understand that they may make various changes, substitutions and alterations herein without departing from the spirit and scope of the present disclosure. In one embodiment, the semiconductor substrate may alternatively includes other semiconductor material, such as diamond, silicon carbide, gallium arsenic, GaAsP, AlInAs, AlGaAs or GaInP. In furtherance of the above example, the sources and drains are formed in an epitaxy grown semiconductor different from silicon to achieve the strained channel. In one embodiment, the silicon germanium (SiGe) is formed in a first active region by an epitaxy process on the silicon substrate to form the sources and drains of the PMOS transistors. In another embodiment, the silicon carbide (SiC) is formed in a second active region by an epitaxy process on the silicon substrate to form the sources and drains of the NMOS transistors. In another embodiment, the transistor region includes PMOS transistors with source/drain regions of epi SiGe in a first active region of n-type dopant and NMOS transistors with source/drain regions of epi SiC in a second active region of p-type dopant. A channel is defined in the substrate and configured between the source and drain of each transistor, and underlying the associated gate. The channel is thus strained to enable the carrier mobility of the device and enhance the device performance by the spitaxy grown semiconductor.

In another embodiment, a gate in each transistor includes a high k dielectric material layer disposed on the substrate, a metal layer disposed on the high k dielectric material layer. Additionally, an interfacial layer, such as silicon oxide, may be interposed between the high k dielectric material layer and the metal layer. The metal gate for both operational devices and isolation gates are similar in terms of composition, dimension, formation and structure. These gate stacks can be formed in a single process. In one embodiment, a high k dielectric material layer is formed on the semiconductor substrate. A metal gate layer is formed on the high k dielectric material layer. A capping layer is further interposed between the high k dielectric material layer and the metal gate layer. The high k dielectric material layer is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes $HfO_2$. In another embodiment, the high k dielectric material includes $Al_2O_3$.

Alternatively, the high k dielectric material layer includes metal nitrides, metal silicates or other metal oxides. The metal gate layer is formed by PVD or other suitable process. The metal gate layer includes titanium nitride. In another embodiment, the metal gate layer includes tantalum nitride, molybdenum nitride or titanium aluminum nitride. The capping layer is interposed between the high k dielectric material layer and the metal gate layer. The capping layer includes lanthanum oxide (LaO). The capping layer may alternatively includes other suitable material. Then the various gate material layers are patterned to form gate stacks for both operational devices and the dummy gates. The method to pattern the gate material layers includes applying various dry and wet etching steps, using a patterned mask defining various openings. The gate layers within the openings of the patterned mask are removed by the one or etching processes.

In another embodiment, the semiconductor substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method. In another embodiment, the formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more ion implantation steps are further performed to form various sources and drains, and/or light doped drain (LDD) features. In one example, the LDD regions are formed after the formation of the gate stack and/or the epi source and drain region, and therefore aligned with the gates. A gate spacer may be formed on the sidewalls of the metal gate stack. Then heavy source and drain doping processes are performed to form heavy doped sources and drains, and therefore the heavy doped sources and drains are substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials. Silicide are formed on the sources and drains to reduce the contact resistance. Then silicide can be formed on the sources and drains by a process including depositing a metal layer, annealing the metal layer such that the metal layer is able to react with silicon to form silicide, and then removing the non-reacted metal layer.

Then an inter-level dielectric (ILD) layer is formed on the substrate and a chemical mechanical polishing (CMP) process is further applied to the substrate to polish the substrate. In another example, an etch stop layer (ESL) is formed on top of the gate stacks before forming the ILD layer. In one embodiment, the gate stacks formed above are final metal gate structure and remain in the final circuit. In another embodiment, the thus formed gate stacks are partially removed and then refilled with proper materials for various fabrication consideration such as thermal budget. In this case, the CMP process is continued until the polysilicon surface is exposed. In another embodiment, the CMP process is stopped on the hard mask layer and then the hard mask is removed by a wet etching process.

A multilayer interconnection (MLI) is formed on the substrate to electrically connect various device features to form a functional circuit. The multilayer interconnection includes vertical interconnects, such as contacts or vias, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes. The contacts includes gate contacts, source/drain contacts. The present disclosure provides a gate contact structure having a non-conventional geometry. Instead of a square gate contact, the disclosed gate contact has a portion with elongated shape. In one embodiment, the elongated portion is substantially aligned with the associated gate such that the contact area between the gate contact and the gate is increased without extra cost on chip area, metal layer and/or device performance. In another embodiment, the gate contact has an elongated portion aligned with that corresponding gate and extending to a source/drain adjacent the gate. In another embodiment, the gate contact has an elongated portion substantially perpendicular to the two corresponding gates, and landing on both gates. In another embodiment, the gate contact may includes various combination of the above portions, such as U-shaped contact, T-shaped contact, H-shaped contact, or L-shaped contact.

The disclosed semiconductor structure in various embodiments serve only as examples. The transistors may be alternatively other type of field effect transistors (FET). The disclosed semiconductor structure may be implemented in various applications such as digital circuit, imaging sensor devices, dynamic random access memory (DRAM) cell, input/output circuit, and/or other microelectronic devices. In another embodiment, the disclosed semiconductor structure may be incorporated to form FinFET transistors. Of course, aspects of the present disclosure are also applicable and/or readily adaptable to other type of transistor and may be employed in many different applications, including sensor cells, memory cells, logic cells, and others.

Thus, the present disclosure provides an integrated circuit. The device includes an active region in a semiconductor substrate; an isolation region adjacent the active region; a gate disposed on the active region and extending to the isolation region in a first direction; and a gate contact disposed within the isolation region, having a portion directly overlying and contacting the gate, and having a geometry horizontally extending to a first dimension in the first direction and a second dimension in a second direction approximately perpendicular to the first direction. The first dimension is greater than the second dimension.

The present disclosure also provides another embodiment of a field effect transistor (FET) in integrated circuit. The FET includes an active region in a semiconductor substrate; an isolation region adjacent the active region; a gate disposed on the active region, and extending to the isolation region in a first direction; a source and a drain formed in the active region and spaced in a second direction approximately perpendicular to the first direction; and a gate contact disposed within the isolation region and having a portion directly overlying and contacting the gate, wherein the gate contact, in a top view, includes outlines defining a first dimension in the first direction and a second dimension in the second direction, the first dimension being greater than the second dimension.

The present disclosure also provides another embodiment of an integrated circuit. The integrated circuit includes an active region in a semiconductor substrate; an isolation region adjacent the active region; first and second gates disposed on the active region, and extending to the isolation region in a first direction, wherein the first and second gates are spaced in a second direction approximately perpendicular to the first direction; and a gate contact having portions respectively overlying and contacting the first and second gates within the isolation region.

The present disclosure also provides another embodiment of an integrated circuit. The integrated circuit includes an active region in a semiconductor substrate; an isolation region adjacent the active region; a gate disposed on the active region, and extending to the isolation region in a first direction; and a gate contact having an elongated portion overlying and contacting the gates within the isolation region.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device in an integrated circuit, comprising:
   an active region in a semiconductor substrate;
   an isolation region adjacent the active region;
   a gate disposed on the active region and extending from the active region to the isolation region in a first direction; and
   a gate contact disposed within the isolation region, having a portion directly overlying and contacting the gate, and having a geometry horizontally extending to a first dimension in the first direction and a second dimension in a second direction approximately perpendicular to the first direction, the first dimension being greater than the second dimension.

2. The device of claim 1, wherein the geometry of the gate contact is substantially a rectangle in a top view of device.

3. The device of claim 1, wherein the first dimension ranges between about 60 nm and about 120 nm and the second dimension is about 40 nm.

4. The device of claim 1, wherein the gate contact includes another portion disposed within the isolation region and extending in the second direction to reach an adjacent gate.

5. The device of claim 1 further comprising a source and a drain spaced in the second direction, disposed within the active region, and interposed by the gate.

6. The device of claim 5, wherein the gate contact further includes:
   a first extended portion extending in the second direction within the isolation region; and
   a second extended portion extending in the first direction to one of the source and drain in the active region.

7. The device of claim 6, further comprising a field effect transistor including the gate, the source and the drain.

8. The device of claim 6, wherein the gate contact is substantially L-shaped in a top view of the device.

9. The device of claim 1, further comprising a channel region defined between the source and drain, configured within the active region, and approximately aligned in the second direction.

10. A field effect transistor (FET) in an integrated circuit, comprising:
    an active region in a semiconductor substrate;
    an isolation region adjacent the active region;
    a gate disposed on the active region and extending from the active region to the isolation region in a first direction;
    a source and a drain formed in the active region and spaced in a second direction approximately perpendicular to the first direction; and
    a gate contact disposed within the isolation region and having a portion directly overlying and contacting the gate, wherein the gate contact, in a top view, includes outlines defining a first dimension in the first direction and a second dimension in the second direction, the first dimension being greater than the second dimension.

11. The FET of claim 10, wherein the gate contact includes an extended portion extending within the isolation region and along the second direction, and contacting an adjacent gate contact of an adjacent FET.

12. The FET of claim 10, wherein the gate contact further includes
    a first extended portion extending in the second direction within the isolation region; and
    a second extended portion extending in the first direction to one of the source and drain in the active region.

13. An integrated circuit, comprising:
    an active region in a semiconductor substrate;
    an isolation region adjacent the active region;
    first and second gates disposed on the active region, and extending to the isolation region in a first direction, wherein the first and second gates are spaced in a second direction approximately perpendicular to the first direction; and
    a gate contact having portions respectively overlying and contacting the first and second gates within the isolation region.

14. The integrated circuit of claim 13, wherein the gate contact extends to and contacts a portion of the active region between the first and second gates.

15. The integrated circuit of claim 14, wherein the gate contact has a T-shape in a top view of the integrated circuit.

16. The integrated circuit of claim 13, wherein the gate contact extends to and contacts a portion of the active region on a side of the first gate remote the second gate.

17. The integrated circuit of claim 16, wherein the gate contact extends to and contacts another portion of the active region on a side of the second remote the second gate.

18. The integrated circuit of claim 17, wherein the gate contact has an U-shape shape in a top view of the integrated circuit.

19. The integrated circuit of claim 13, wherein the gate contact has an H-shape in a top view of the integrated circuit.

20. The integrated circuit of claim 13, wherein the first and second gates each includes outlines straightly extending in the first direction.

* * * * *